United States Patent
Lee

(10) Patent No.: US 8,101,493 B2
(45) Date of Patent: Jan. 24, 2012

(54) CAPACITOR OF SEMICONDUCTOR DEVICE AND METHOD FOR MANUFACTURING THE SAME

(75) Inventor: Yong-Jun Lee, Yeonsu-gu (KR)

(73) Assignee: Dongbu HiTek Co., Ltd., Seoul (KR)

( * ) Notice: Subject to any disclaimer, the term of this patent is extended or adjusted under 35 U.S.C. 154(b) by 72 days.

(21) Appl. No.: 12/648,910

(22) Filed: Dec. 29, 2009

(65) Prior Publication Data

US 2010/0164065 A1  Jul. 1, 2010

(30) Foreign Application Priority Data

Dec. 30, 2008  (KR) .................. 10-2008-0137572

(51) Int. Cl.
*H01L 29/02* (2006.01)

(52) U.S. Cl. . 438/381; 438/250; 438/393; 257/E21.011; 257/E29.343

(58) Field of Classification Search .................. 257/532; 438/250, 381, 393
See application file for complete search history.

(56) References Cited

U.S. PATENT DOCUMENTS

| | | | |
|---|---|---|---|
| 2002/0123008 A1* | 9/2002 | Ning | 430/318 |
| 2005/0014343 A1* | 1/2005 | Lee et al. | 438/393 |
| 2006/0001063 A1* | 1/2006 | Lee | 257/295 |
| 2009/0127655 A1* | 5/2009 | Lee | 257/532 |

FOREIGN PATENT DOCUMENTS

KR    2006-114056    * 11/2006

* cited by examiner

*Primary Examiner* — Ahmed Sefer
(74) *Attorney, Agent, or Firm* — Sherr & Vaughn, PLLC

(57) ABSTRACT

A capacitor of a semiconductor device and a method for manufacturing the same includes a lower metal layer on and/or over a semiconductor substrate; an insulating layer formed on and/or over the lower metal layer with step difference; and an upper electrode on and/or over the insulating layer pattern, wherein a top corner of the upper electrode is rounded so that a curvature pattern is formed on the top corner of the upper electrode.

8 Claims, 3 Drawing Sheets

CAPACITOR OF SEMICONDUCTOR DEVICE AND METHOD FOR MANUFACTURING THE SAME

The present application claims priority under 35 U.S.C. 119 to Korean Patent Application No. 10-2008-0137572 (filed on Dec. 30, 2008), which is hereby incorporated by reference in its entirety.

BACKGROUND

A method for forming a related MIM (metal insulator metal) capacitor of a semiconductor device will be described with reference to FIG. 1. First, a typical semiconductor logic process is performed on a semiconductor substrate, such as a silicon substrate, and an interlayer dielectric layer is formed on the semiconductor substrate. Then, a lower metal layer 10 is formed on the interlayer dielectric layer and an insulating layer 12 is deposited on the lower metal layer 10. The insulating layer 12 can be formed in a single layer structure or a multi-layer structure by using SiN, $SiH_4$, or SiON. Next, an upper metal layer 14 including TiN is deposited on the insulating layer.

A photoresist pattern for patterning an upper electrode of the MIM capacitor is formed on the upper metal layer 14. After that, the upper metal layer 14 is etched by performing a plasma etching process using Cl-based gas, thereby forming the upper electrode of the capacitor. Then, an insulating layer formed below the upper electrode is etched by performing a plasma etching process using F-based gas.

As the etching processes have been finished, the pattern is removed and a process for depositing an interlayer dielectric layer including IMD (inter metal dielectric) material is performed. However, the method for forming the related MIM capacitor represents disadvantages in terms of TDDB (time dependent dielectric breakdown). During the MIM etching process for forming the MIM capacitor, an end part of an MIM layer is formed with a relatively thin thickness, so that the electric field is concentrated on the end part of the MIM layer. Thus, when the TDDB test is performed, the end part of the MIM layer may be melted, thereby causing disconnection between metals.

SUMMARY

Embodiments relate to a method for forming an MIM (metal insulator metal) capacitor of a semiconductor device. More particularly, embodiments relate to a method for forming an MIM capacitor of a semiconductor device, capable of maximizing properties of an end part of an MIM layer. Embodiments relate to a method for forming an MIM capacitor of a semiconductor device, capable of maximizing properties of an end part of an MIM layer by rounding a corner part of an upper electrode of the MIM capacitor.

A method for forming a capacitor of a semiconductor device according to embodiments includes: forming a photoresist pattern on and/or over an upper metal layer used for forming the capacitor; performing an etching process with respect to the photoresist pattern such that corners of the photoresist pattern are rounded; and etching the upper metal layer by using the photoresist pattern having rounded corners as a mask, thereby forming an upper electrode.

A capacitor of a semiconductor device according to embodiments includes: a lower metal layer on and/or over a semiconductor substrate; an insulating layer formed on and/or over the lower metal layer with step difference; and an upper electrode on and/or over the insulating layer pattern, wherein a top corner of the upper electrode is rounded so that a curvature pattern is formed on the top corner of the upper electrode.

DRAWINGS

DESCRIPTION

Figure 1:
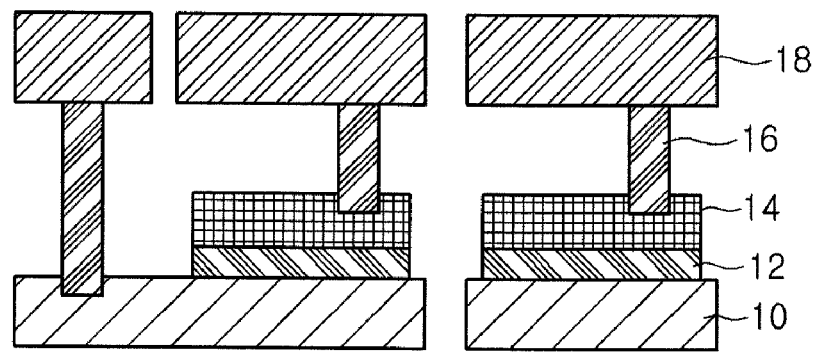
FIG. 1 is a sectional view showing a procedure for forming a related capacitor.
Figure 2A:
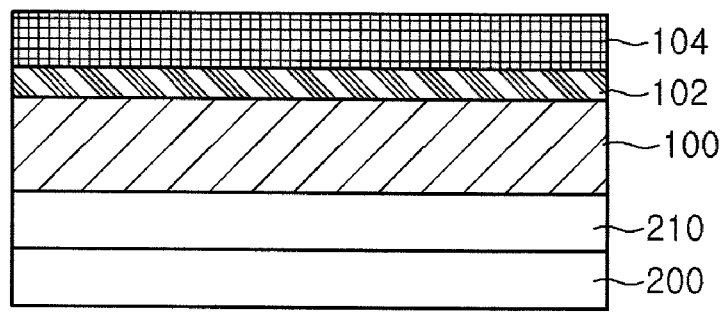
FIGS. 2A to 2E are sectional views showing a procedure for forming a capacitor according to embodiments.

Hereinafter, embodiments will be described in detail with reference to accompanying drawings. FIGS. 2A to 2E are sectional views showing the procedure for forming a capacitor according to embodiments. The method for forming the capacitor according to embodiments will be described with reference to FIGS. 2A to 2E. First, as shown in FIG. 2A, a semiconductor logic process is performed on a semiconductor substrate, such as a silicon substrate 200, and an interlayer dielectric layer 210 is formed on and/or over the silicon substrate 200. Then, a lower metal layer 100, for example, an AlCu layer is formed on and/or over the interlayer dielectric layer 210. Although not shown, a barrier metal layer and an anti-reflective layer can be sequentially formed on top and bottom surfaces of the lower metal layer 100. The barrier metal layer and the anti-reflective layer may include Ti/TiN.

Then, an insulating layer 102 may be deposited on and/or over the anti-reflective layer by using plasma enhance deposition equipment. The insulating layer 102 can be formed in a single layer structure or a multi-layer structure by using SiN, $SiH_4$, and SiON. The insulating layer 102 can be deposited under the low temperature condition by using the plasma enhanced deposition equipment because the lower metal layer 100 may be melted when the process is performed at the high temperature of 400° C. or above.

Figure 2B:
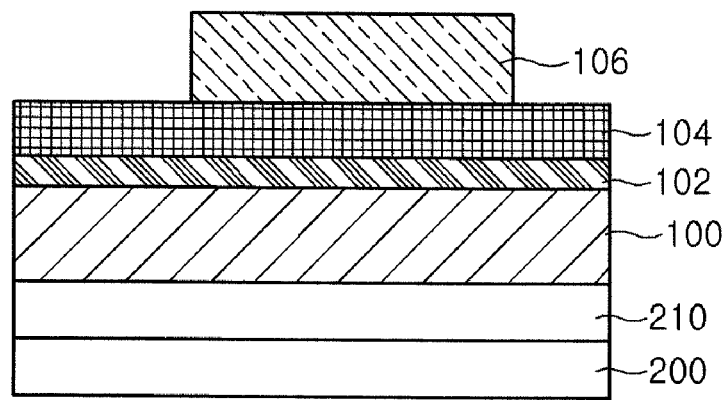

Next, an upper metal layer 104 may be deposited on and/or over the insulating layer 102. The upper metal layer 104 may include a Ti/Tin layer or a TiN layer and serve as an upper electrode, which will be described later. Then, as shown in FIG. 2B, a photoresist is coated on the upper metal layer and photo and etching processes are performed with respect to the photoresist, thereby defining an MIM capacitor region. In other words, a photoresist pattern 106 for patterning an upper electrode of the MIM capacitor is formed.

Figure 2C:
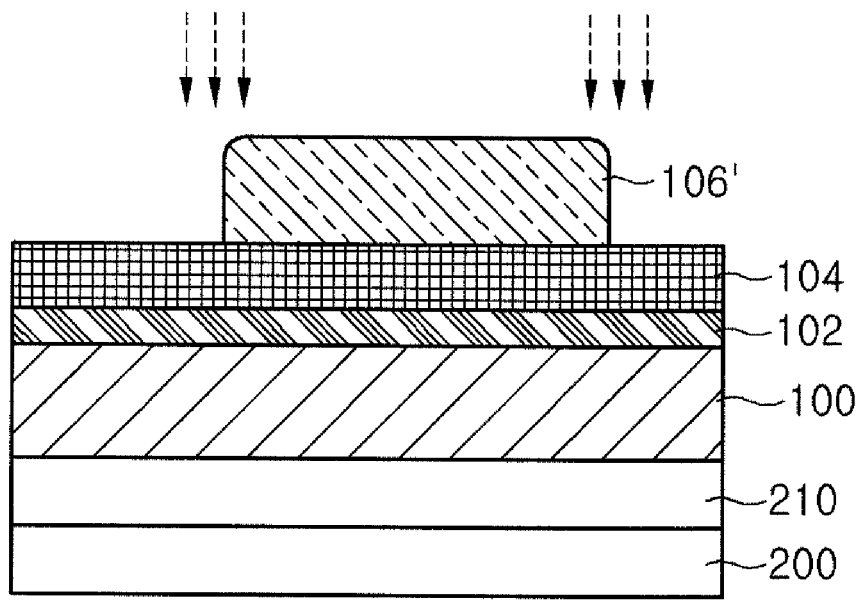
Figure 2D:
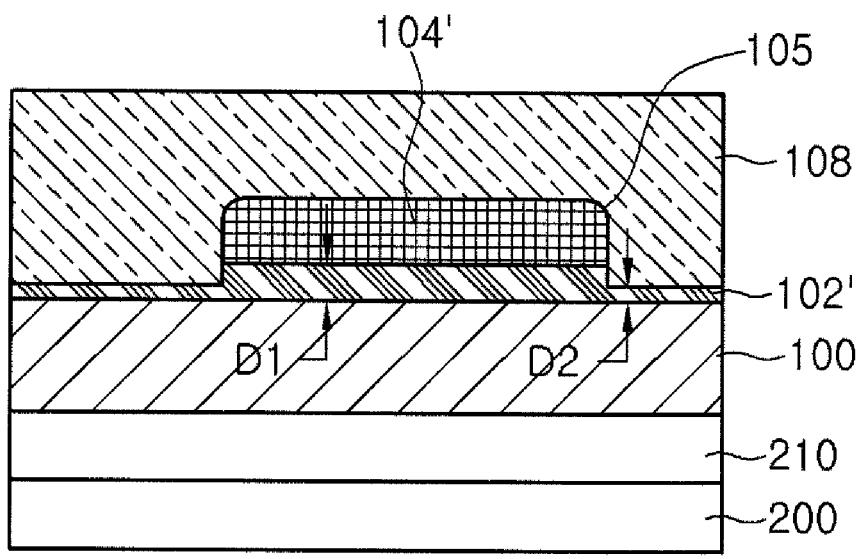

After that, as shown in FIG. 2C, a primary etching process may be performed for the purpose of corner rounding of the photoresist pattern 106. That is, different from the related capacitors in which the MIM capacitor region is etched just after the process shown in FIG. 2B has been finished, according to embodiments, corners of the photoresist pattern 106 may be primarily rounded through the primary etching process before the MIM capacitor region is etched. In FIG. 2C, reference numeral 106' represents a photoresist pattern after the primary etching process has been performed for the purpose of corner rounding of the photoresist pattern 106. Then, as shown in FIG. 2D, a secondary etching process may be performed with respect to the MIM capacitor region by using the photoresist pattern 106' shown in FIG. 2C as a mask.

In detail, the upper metal layer 104 may be etched by performed a plasma etching process using, for example, a Cl-based gas, thereby forming an upper electrode 104'. Then, an insulating layer 102 formed below the upper metal layer 104 may be etched by performing a plasma etching process using, for example, an F-based gas, thereby forming an insulating layer pattern 102'. The insulating layer pattern 102' may have step difference.

The upper electrode 104' can be used as an etch mask when the insulating layer pattern 102' is formed. Referring to FIG. 2D, as the secondary etching process is performed by using the photoresist pattern 106' as the mask, the upper electrode 104' having rounded corners can be formed. The rounded corners of the upper electrode 104' will be referred to as a curvature pattern 105.

In addition, the insulating layer pattern 102' formed below the upper electrode 104' may have a width equal to a width of the upper electrode 104'. Further, the insulating layer pattern 102' may have a first thickness D1 at a region corresponding to the upper electrode 104', and a second thickness D2 at remaining regions. The second thickness D2 may be smaller than the first thickness D1. As the secondary etching process has been finished, the photoresist pattern 106' having the rounded corners can be removed and an interlayer dielectric layer 108, such as IMD (interlayer metal dielectric) layer, may be deposited.

Figure 2E:
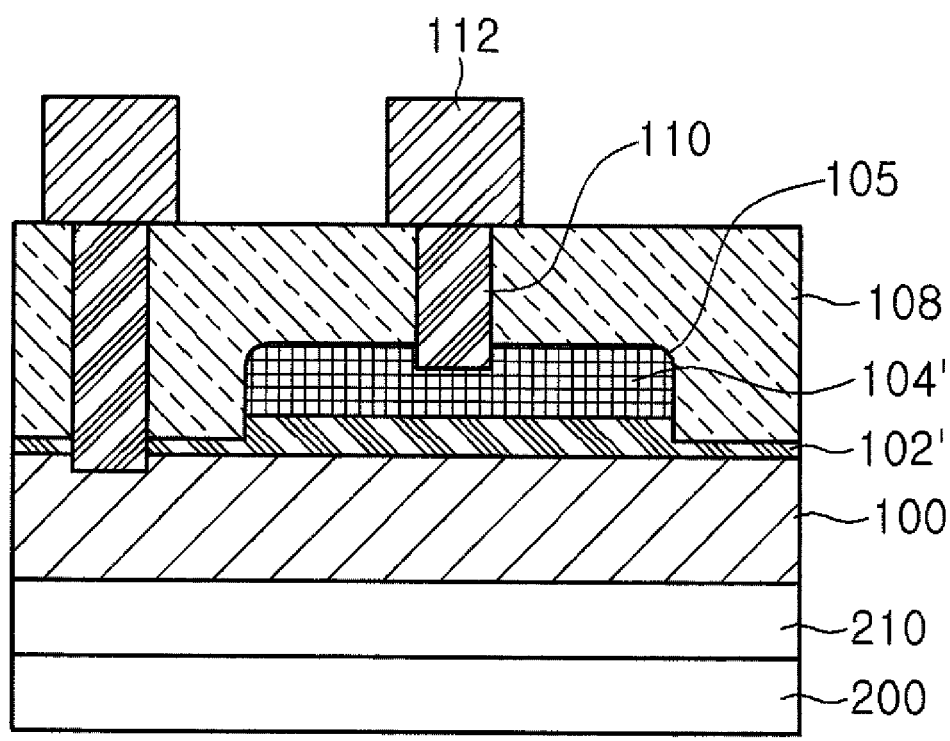

Then, as shown in FIG. 2E, a via 110 may be formed through a via forming process, and then a process for forming an upper metal layer 112 can be performed. As described above, according to embodiments, the photoresist pattern can be formed on and/or over every region except for the MIM capacitor region by performing the exposure process. The photoresist pattern is subject to the etching process so that the corners of the photoresist pattern are rounded. Then, the upper electrode having the rounded corners can be formed by using the rounded photoresist pattern. That is, the properties of the end part of the MIM layer can be maximized by rounding corners of the upper electrode of the MIM capacitor, thereby improving the product yield of the semiconductor devices.

It will be obvious and apparent to those skilled in the art that various modifications and variations can be made in the embodiments disclosed. Thus, it is intended that the disclosed embodiments cover the obvious and apparent modifications and variations, provided that they are within the scope of the appended claims and their equivalents.

What is claimed is:

1. A method comprising:
    forming a photoresist pattern over an upper metal layer used for forming a capacitor of a semiconductor device;
    performing an etching process with respect to the photoresist pattern such that corners of the photoresist pattern are rounded;
    etching the upper metal layer by using the photoresist pattern having rounded corners as a mask, thereby forming an upper electrode;
    forming a lower metal layer over a semiconductor substrate before forming the upper metal layer; and
    forming the upper metal layer after forming an insulating layer over the lower metal layer,
    wherein, when forming the upper electrode, an insulating layer pattern is formed by etching the insulating layer formed below the upper electrode,
    wherein the insulating layer pattern has a first thickness at a region corresponding to the upper electrode and a second thickness at remaining regions, in which the second thickness is smaller than the first thickness.

2. The method of claim 1, wherein a top corner of the upper electrode is rounded so that a curvature pattern is formed on the top corner of the upper electrode.

3. The method of claim 1, wherein the insulating layer comprises SiN.

4. The method of claim 1, wherein the insulating layer comprises $SiH_4$.

5. The method of claim 1, wherein the insulating layer comprises SiON.

6. The method of claim 1, wherein the insulating layer is formed through a plasma enhanced deposition process.

7. The method of claim 1, wherein the upper metal layer is etched through a plasma etching process using Cl-based gas.

8. The method of claim 1, wherein the insulating layer is etched through a plasma etching process using F-based gas.

* * * * *